United States Patent
Aherne et al.

(10) Patent No.: US 12,540,975 B2
(45) Date of Patent: Feb. 3, 2026

(54) 125V SWITCH GLITCH MITIGATION

(71) Applicant: Analog Devices International Unlimited Company, Limerick (IE)

(72) Inventors: David Aherne, Limerick (IE); Barry P Kinsella, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 217 days.

(21) Appl. No.: 18/038,638

(22) PCT Filed: Dec. 2, 2021

(86) PCT No.: PCT/EP2021/084047
§ 371 (c)(1),
(2) Date: May 24, 2023

(87) PCT Pub. No.: WO2022/122561
PCT Pub. Date: Jun. 16, 2022

(65) Prior Publication Data
US 2024/0036114 A1 Feb. 1, 2024

Related U.S. Application Data

(60) Provisional application No. 63/123,051, filed on Dec. 9, 2020.

(51) Int. Cl.
*G01R 31/319* (2006.01)
*G01R 31/28* (2006.01)

(52) U.S. Cl.
CPC ... *G01R 31/31924* (2013.01); *G01R 31/2879* (2013.01)

(58) Field of Classification Search
CPC ............... G01R 31/31; G01R 31/319; G01R 31/31924; G01R 31/28; G01R 31/2879;
(Continued)

(56) References Cited

U.S. PATENT DOCUMENTS 4,704,575 A 11/1987 Arnoux et al.
5,010,297 A 4/1991 Babcock
(Continued)

FOREIGN PATENT DOCUMENTS

CN 105680431 B 7/2018
CN 116615662 8/2023
(Continued)

OTHER PUBLICATIONS

"25V Span, 800mA Device Power Supply (DPS)", Maxim Integrated Products, (2011), 24 pgs.
(Continued)

*Primary Examiner* — Son T Le
(74) *Attorney, Agent, or Firm* — Schwegman Lundberg & Woessner, P.A.

(57) ABSTRACT

A signal driver system can include one or more force amplifiers configured to provide drive signals to an output node, such as a device under test (DUT) node. The system can include a first switch circuit coupled between a first force amplifier and the output node, and the first switch circuit can include multiple parallel instances of switch circuits with respective different resistance characteristics. The system can include a second switch circuit coupled between a second force amplifier and the output node. The system can include a control circuit configured to control the switch circuit instances of the first switch circuit to mitigate glitch at the output node, for example, when switching between the first and second drive signals.

17 Claims, 6 Drawing Sheets

US 12,540,975 B2
Page 2

(58) Field of Classification Search
CPC . G01R 31/2834; G01R 31/2841; H03F 1/523; H03F 3/04; H03F 3/16; H03F 2200/441; H03F 2200/444; H03F 2200/453; H03F 3/301
See application file for complete search history.

(56) References Cited

U.S. PATENT DOCUMENTS

| | | |
|---|---|---|
| 5,463,315 A | 10/1995 | Grace et al. |
| 5,745,003 A | 4/1998 | Wakimoto et al. |
| 5,917,331 A | 6/1999 | Persons |
| 6,563,352 B1 | 5/2003 | Gohel et al. |
| 6,677,775 B2 | 1/2004 | Babcock |
| 6,756,807 B2 | 6/2004 | Johnson et al. |
| 6,900,621 B1 | 5/2005 | Gunther |
| 6,980,021 B1 | 12/2005 | Srivastava et al. |
| 7,154,260 B2 | 12/2006 | Chow |
| 7,174,143 B1 | 2/2007 | Turvey |
| 7,521,937 B2 | 4/2009 | Nagata |
| 7,538,539 B1 | 5/2009 | Balke |
| 7,903,008 B2 | 3/2011 | Regier |
| 7,978,109 B1 | 7/2011 | Kuramochi |
| 8,207,725 B2 | 6/2012 | Sullivan et al. |
| 8,710,541 B2 | 4/2014 | Aherne et al. |
| 8,829,975 B2 | 9/2014 | Aherne |
| 8,975,913 B2 | 3/2015 | Smith |
| 9,182,767 B2 | 11/2015 | Srivastava et al. |
| 9,397,635 B2 | 7/2016 | Costa |
| 9,435,863 B2 | 9/2016 | Chen et al. |
| 9,523,722 B2 | 12/2016 | Tasher et al. |
| 9,671,427 B2 | 6/2017 | Johnson et al. |
| 10,192,630 B1 | 1/2019 | Hoskins |
| 10,345,418 B2 | 7/2019 | Wadell et al. |
| 10,778,212 B1 | 9/2020 | DAquino et al. |
| 11,022,629 B2 | 6/2021 | D'aquino et al. |
| 11,054,444 B2 | 7/2021 | Borthwick |
| 11,105,843 B2 | 8/2021 | Singh et al. |
| 11,940,496 B2 | 3/2024 | Harrell et al. |
| 12,216,164 B2 | 2/2025 | Harrell et al. |
| 2002/0021148 A1 | 2/2002 | Goren et al. |
| 2002/0121885 A1 | 9/2002 | Taylor et al. |
| 2006/0176519 A1 | 8/2006 | Ouchi |
| 2006/0273811 A1 | 12/2006 | Haigh et al. |
| 2007/0069755 A1 | 3/2007 | Sartschev |
| 2007/0216445 A1 | 9/2007 | Raghavan et al. |
| 2009/0189573 A1 | 7/2009 | Turchi et al. |
| 2011/0115544 A1 | 5/2011 | Birk |
| 2012/0105066 A1 | 5/2012 | Marvin et al. |
| 2012/0229107 A1* | 9/2012 | Chen .................. H02M 3/1588 323/271 |
| 2012/0280743 A1 | 11/2012 | Steiner |
| 2014/0070831 A1 | 3/2014 | Kushnick et al. |
| 2015/0038092 A1 | 2/2015 | Andrys et al. |
| 2016/0241019 A1 | 8/2016 | Li |
| 2017/0269149 A1 | 9/2017 | Mcquilkin |
| 2020/0011928 A1 | 1/2020 | Mücke et al. |
| 2020/0041546 A1 | 2/2020 | Liberty |
| 2020/0127624 A1 | 4/2020 | Basilico et al. |
| 2020/0271717 A1 | 8/2020 | Nakamura et al. |
| 2021/0021257 A1 | 1/2021 | Shrivastava et al. |
| 2021/0255268 A1 | 8/2021 | Golger |
| 2023/0114208 A1 | 4/2023 | Harrell et al. |
| 2023/0176110 A1 | 6/2023 | Harrell et al. |

FOREIGN PATENT DOCUMENTS

| | | |
|---|---|---|
| CN | 116615662 A | 8/2023 |
| DE | 112021006392 | 9/2023 |
| DE | 112021006392 T5 | 9/2023 |
| JP | H11133068 A | 5/1999 |
| JP | 2000214222 A | 8/2000 |
| JP | 2002023869 A | 1/2002 |
| JP | 2008209997 A | 9/2008 |
| JP | 2008301287 A | 12/2008 |
| JP | 2010038581 A | 2/2010 |
| JP | 2011043434 A | 3/2011 |
| JP | 2019207253 A | 12/2019 |
| TW | 200842384 A | 11/2008 |
| TW | I354804 B | 12/2011 |
| TW | I814168 | 9/2023 |
| TW | I814168 B | 9/2023 |
| WO | WO-2008059766 A1 | 5/2008 |
| WO | WO-2008090627 A1 | 7/2008 |
| WO | WO-2021173635 A1 | 9/2021 |
| WO | WO-2021173638 A1 | 9/2021 |
| WO | WO-2022122561 A1 | 6/2022 |

OTHER PUBLICATIONS

"International Application Serial No. PCT/EP2021/084047, International Search Report mailed Apr. 29, 2022", 4 pgs.
"International Application Serial No. PCT/EP2021/084047, Written Opinion mailed Apr. 29, 2022", 10 pgs.
"International Application Serial No. PCT/US2021/019368, International Preliminary Report on Patentability mailed Sep. 9, 2022", 8 pgs.
"International Application Serial No. PCT/US2021/019368, International Search Report mailed Jun. 14, 2021", 4 pgs.
"International Application Serial No. PCT/US2021/019368, Written Opinion mailed Jun. 14, 2021", 6 pgs.
"International Application Serial No. PCT/US2021/019372, International Preliminary Report on Patentability mailed Sep. 9, 2022", 7 pgs.
"International Application Serial No. PCT/US2021/019372, International Search Report mailed Jun. 8, 2021", 3 pgs.
"International Application Serial No. PCT/US2021/019372, Written Opinion mailed Jun. 8, 2021", 6 pgs.
"Taiwanese Application Serial No. 110145810, Office Action mailed Nov. 4, 2022", W/O English Translation, 12 pgs.
"Taiwanese Application Serial No. 110145810, Response filed Feb. 1, 2023 to Office Action mailed Nov. 4, 2022", w/o English Claims, 53 pgs.
Ding, Jialin, "DC Parametric Test and IDDQ Test Using Advantest T2000 ATE", MS Thesis, Auburn University, (Aug. 1, 2015), 100 pgs.
Liberti, Anselmo Gianluca, et al., "Suppressing voltage glitches in SiC MOSFETs", PCIM Europe 2019, Nuremberg, Germany, (May 7-9, 2019), 7 pgs.
Mauromicale, Giuseppe, "Improvement of SiC power module layout to mitigate the gate-source overvoltage during switching operation", 2019 AEIT International Conference of Electrical and Electronic Technologies for Automotive (AEIT Automotive), IEEE, (2019), 6 pgs.
"U.S. Appl. No. 17/904,931, Non Final Office Action mailed Aug. 2, 2023", 11 pgs.
"U.S. Appl. No. 17/904,931, Notice of Allowance mailed Nov. 20, 2023", 9 pgs.
"U.S. Appl. No. 17/904,931, Response filed Jul. 21, 2023 to Restriction Requirement mailed May 23, 2023", 7 pgs.
"U.S. Appl. No. 17/904,931, Response filed Nov. 1, 2023 to Non Final Office Action mailed Aug. 2, 2023", 10 pgs.
"U.S. Appl. No. 17/904,935, Non Final Office Action mailed Apr. 10, 2024", 17 pgs.
"U.S. Appl. No. 17/904,935, Notice of Allowance mailed Sep. 28, 2024", 9 pgs.
"U.S. Appl. No. 17/904,935, Response filed Jul. 10, 2024 to Non Final Office Action mailed Apr. 10, 2024", 9 pgs.
"International Application Serial No. PCT/EP2021/084047, International Preliminary Report on Patentability mailed Jun. 22, 2023", 12 pgs.
"Japanese Application Serial No. 2023-535032, Notification of Reasons for Rejection mailed Jul. 22, 2025", W/O English Translation, 8 pgs.
"Japanese Application Serial No. 2023-535032, Examiners Decision of Final Refusal mailed Nov. 25, 25", w/ English translation, 6 pgs.

(56) References Cited

OTHER PUBLICATIONS

"Chinese Application Serial No. 202180082606.2, Office Action mailed Dec. 8, 25", w/ English Translation, 29 pgs.

* cited by examiner

125V SWITCH GLITCH MITIGATION

CROSS-REFERENCE TO RELATED APPLICATIONS

This patent application is a U.S. National Stage of PCT Application Serial NO. PCT/EP2021/084047, filed Dec. 2, 2021, published as WO 2022/122561 A1 on Jun. 16, 2022, which claims the benefit of priority to U.S. Provisional Patent Application No. 63/123,051, filed on Dec. 9, 2020, which is incorporated by reference herein in its entirety.

BACKGROUND

Automated test equipment (ATE) can be used to assess the performance of manufactured parts such as integrated circuits. ATE systems can include instrumentation circuitry to apply test signals to a device under test (DUT) and monitor signals from the DUT, such as to check for errors or flaws in the DUT. The test signals applied by the instrumentation circuitry should not cause false indications of failures or mask actual failures of the DUT. The test signals should not cause undue stress or damage to the DUT.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Automated test equipment (ATE) systems can include instrumentation circuitry to apply test signals to a device under test (DUT). The test signals generated by the instrumentation circuitry can include current or voltage signals. The test signals should not cause false indications of failure and should not mask actual failures of the DUT. In some systems, switching between different test signal current ranges can cause undesired glitches or signal aberrations at a test monitoring point, such as at a DUT pin. As a switch state changes, such as to change an operating range for an ATE system, charge injection can be compensated to reduce a glitch at the DUT pin. The magnitude of any glitch, such as relative to a force signal provided by the test system, can be controlled using various solutions discussed herein.

In an example, a solution can include using a segmented switch for one or more of the switching stages in the system. For example, relatively large switches (e.g., corresponding to relatively higher current force or sense paths) can comprise multiple, smaller switches coupled in parallel. During a turn-on phase, the relatively smaller switches can be turned on in a time sequence, such as with a specified time delay between activation of each switch. The time delay can help allow amplifier circuits and feedback in the ATE system to correct for any disturbance caused during the switch turn-on phase.

During a turn-off phase, a gate-source voltage, Vgs, for one or more switches in a switching stage, or switching channel, can be reduced to about zero to first turn the switch channel off. The source terminals of, e.g., back-to-back NDMOS devices that comprise the switching stage or switching channel, and the gate terminals of the same devices, can be pulled to a reference (e.g., to a most-negative reference terminal or $V_{EE}$). The switch turn-off can cause a disturbance that can be mitigated, for example, by controlling a pull to the reference voltage, such as using an in-line adjustable current source. The controlled pull can help allow the internal amplifier circuits and feedback in the ATE system to correct for any disturbance caused during the switch turn-off.

Figure 1:
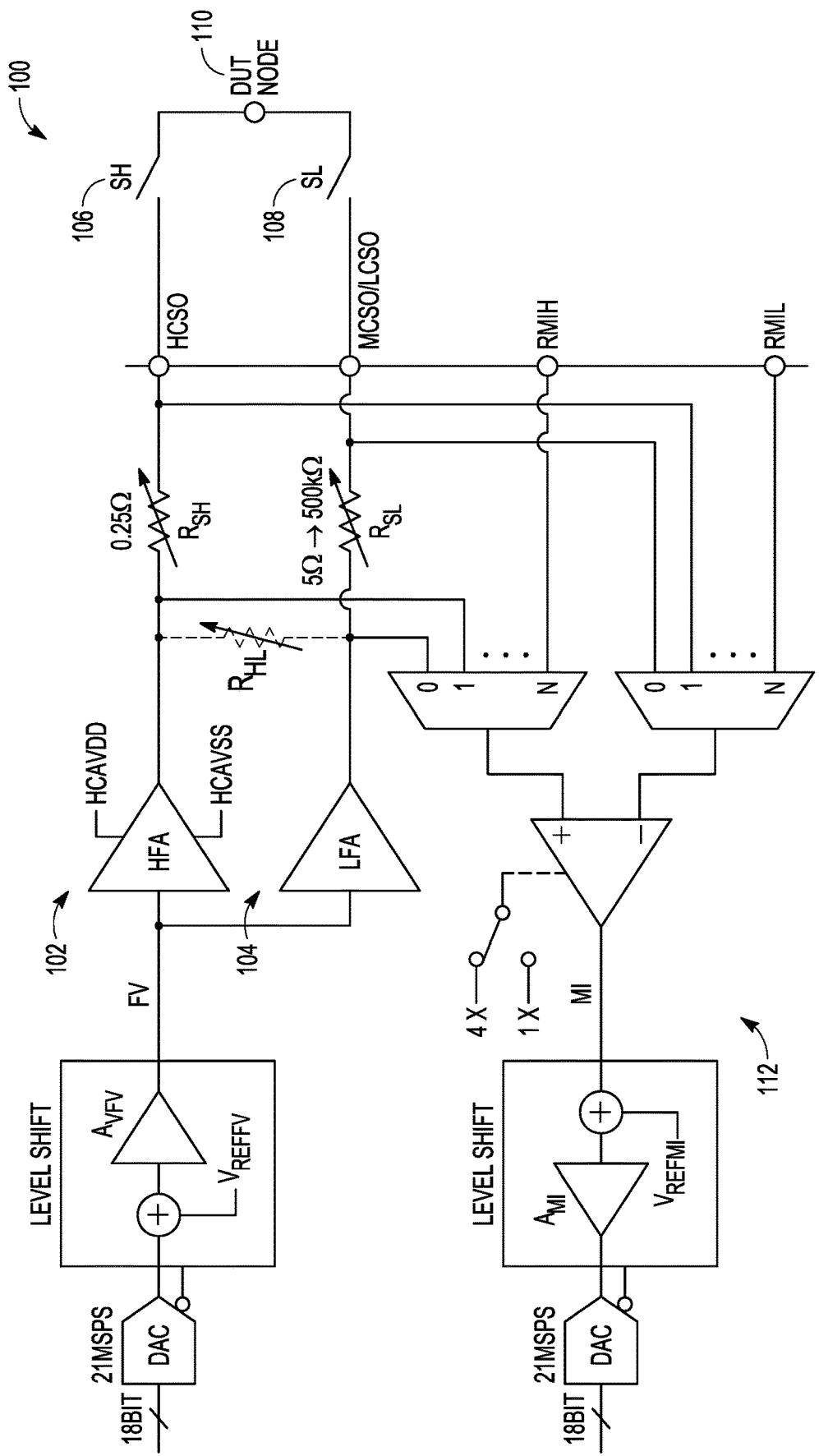
FIG. 1 illustrates generally an example of a portion of an automated test system.

FIG. 1 illustrates generally a schematic of a portion of a first automated test system 100. The first automated test system 100 includes a first output stage 102 and a second output stage 104. Each output stage includes a respective force amplifier that is configured to provide at least a portion of a test signal. For example, the first output stage 102 includes a relatively higher-current force amplifier (HFA), and the second output stage 104 includes a relatively lower-current force amplifier (LFA). The HFA and LFA are coupled to a high-side switch circuit 106 (SH) and a low-side switch circuit 108 (SL) respectively. The high-side switch circuit 106 and the low-side switch circuit 108 can be coupled to an output node or DUT node 110. In an example, the DUT node 110 comprises an input/output (I/O) connection and the test system includes DUT signal monitoring circuitry, such as a comparator, to monitor a DUT response to a test signal.

Various factors can contribute to glitch, or undesired transient behavior, in an output signal at the DUT node 110. For example, voltages across each of the first output stage 102 and the second output stage 104 can be different and load-current dependent. A rapid transition in the output signal source from one output stage to the other output stage can cause an undesirable glitch, or transient signal spike, in the output signal, such as due to charge injection from the high-side switch circuit 106 or the low-side switch circuit 108. In an example, impedance characteristics of the HFA or LFA can contribute to glitch. In another example, shunt resistors or other in-line impedances in the first output stage 102 and the second output stage 104 can contribute to glitch.

In one approach to minimize glitch, each of the output stage amplifiers HFA and LFA can include a current clamp circuit that sets a level of output current for the amplifier. A control circuit, such as can include processing circuitry (e.g., one or more of a processor, an application specific integrated circuit, or a field programmable gate array), can help reduce or mitigate glitch at the DUT node 110 by progressively increasing or decreasing a value of the output current for one or both of the HFA and LFA. For example, the controller can progressively decrease the maximum output current provided by an output stage from a higher level (e.g., 200 milliamps (200 mA)), to a lower level (e.g., 0 mA). Conversely, the controller can progressively increase the output current from a lower level (e.g., 0 mA) to a higher level (e.g., 200 mA).

In the example of FIG. 1, the first automated test system 100 includes a feedback network 112. The feedback network 112 can be configured to sense information from the first output stage 102, the second output stage 104, the DUT node 110, or elsewhere. For example, the feedback network 112 can be configured to sense a magnitude of an output signal at the DUT node 110 and, in response, the control circuit can update or adjust a magnitude of an output signal provided by one or both of the HFA and LFA.

Figure 2:
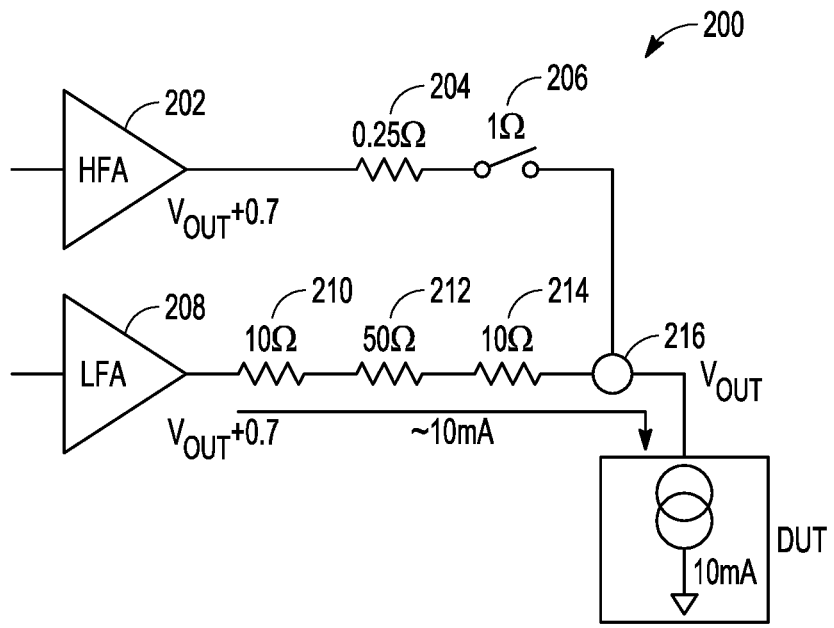
FIG. 2 and FIG. 3 illustrate generally a first example circuit that comprises a portion of an automated test system.

FIG. 2 illustrates generally a first example circuit 200 that comprises a portion of the first automated test system 100. The first example circuit 200 includes a first stage amplifier 202 configured to provide relatively higher magnitude test signals to a DUT node 216 via a series first stage sense resistor 204 and a first stage output switch 206. The first example circuit 200 includes a second stage amplifier 208 configured to provide relatively lower magnitude test signals to the DUT node 216 via a series second stage sense resistor isolation switch 210, a second stage sense resistor 212, and a second stage output switch 214. In the example of FIG. 2, the second stage sense resistor isolation switch 210 and the second stage output switch 214 are pictorially represented by their respective equivalent on-resistance of 10 Ohms. Switches having other resistance characteristics can similarly be used. In an example, the second stage sense resistor isolation switch 210 and the second stage sense resistor 212 can represent an array of switched sense resistor paths having different resistance characteristics.

The example of FIG. 2 illustrates the first example circuit 200 wherein the first stage amplifier 202 and the second stage amplifier 208 are driven by the same control or voltage signal. In a first configuration as illustrated in FIG. 2, the first stage output switch 206 is open and the second stage output switch 214 is closed. In the first configuration, the second stage amplifier 208 provides a test signal $V_{OUT}$ at the DUT node 216 while an output from the first stage amplifier 202 is inhibited from contributing to the test signal by the open first stage output switch 206. In the first configuration, the DUT can draw 10 mA from the second stage amplifier 208. Accordingly, the second stage amplifier 208 can be configured to provide an output signal having a magnitude of $V_{OUT}+0.7$ V, where the additional 0.7 V accounts for the voltage drop due to the series resistance between the output of the second stage amplifier 208 and the DUT node 216.

In an example, it can be desired to change a signal path for one or more signals driving the DUT node 216, such as to change a characteristic of the output signal at the DUT node 216. For example, a source of a DUT drive signal can be changed from, e.g., a first source configured to provide signals in a first magnitude range to a second source configured to provide signals in a different magnitude range. In an example, it can be further desired to avoid an interruption in the output signal at or during the signal path change. That is, the output signal can be maintained such that the DUT receives a constant current (e.g., 10 mA) signal without interruption.

Under ideal conditions, the first stage output switch 206 and the second stage output switch 214 can change states concurrently such that the DUT node 216 receives an uninterrupted signal $V_{OUT}$ from the second stage amplifier 208 initially and then, following the output switch state changes, receives $V_{OUT}$ from the first stage amplifier 202. Additionally or alternatively to opening the second stage output switch 214, the output magnitude of the second stage amplifier 208 can be instantaneously reduced to zero in coordination with switching on the first stage output switch 206. In practice, however, such ideal operating conditions are impractical, and the output signal at the DUT node 216 exhibits a transient glitch coincident with the output switch state change.

Figure 3:
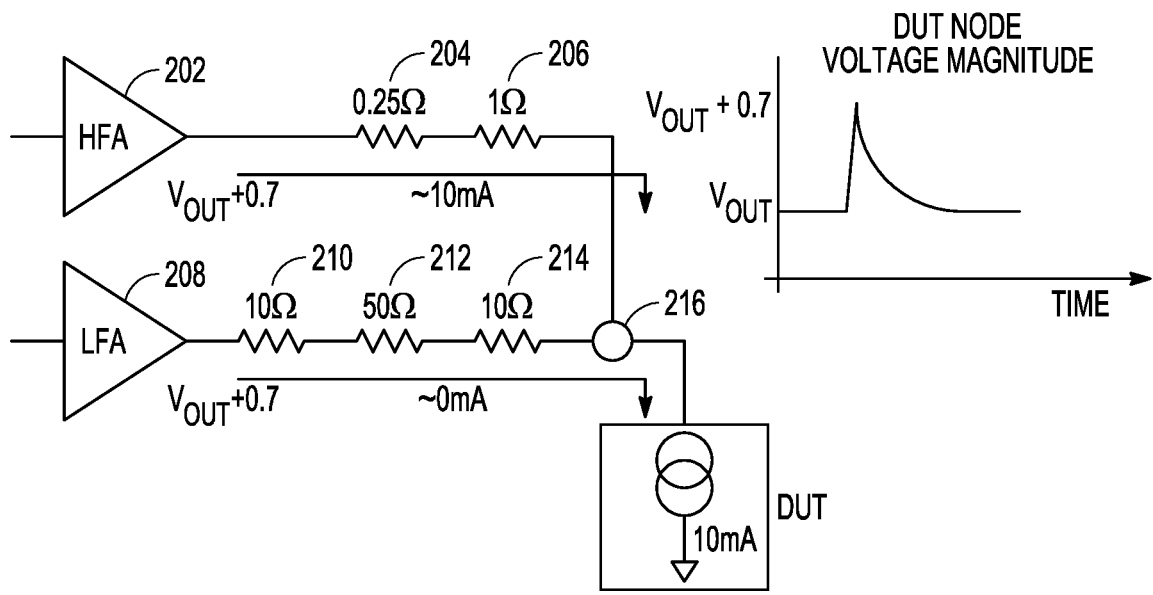

FIG. 3 illustrates generally an example of a second configuration of the first example circuit 200 at or following the output switch state change. Preceding the change, the second stage amplifier 208 can provide its 10 mA signal at a voltage magnitude of $V_{OUT}+0.7$ V, as explained above. At the switch state change, the output of the second stage amplifier 208 can be reduced or switched off (e.g., to 0 mA), and the first stage amplifier 202 can provide a 10 mA output signal to avoid interruption to the DUT. In practice, residual signals and charge storage can occur at or in the output path of the second stage amplifier 208, which can contribute to output signal glitch.

Immediately following the signal source change, the output buffers of, e.g., the first stage amplifier 202 and the second stage amplifier 208, can be held at or around $V_{OUT}+0.7$ V. In the first example circuit 200, a total series resistance between the output of the first stage amplifier 202 and the DUT node 216 can be less than the series resistance in the signal path between the output of the second stage amplifier 208 and the DUT node 216, and therefore the DUT node 216 can experience a glitch of about 0.7 V at the transition. Over time following the transition, the feedback network 112 can be used to adjust the magnitude of the signal provided by the first stage amplifier 202 to correct the magnitude of the output signal. However, the correction provided using the feedback network 112 does not compensate for the glitch introduced at the transition time.

The present inventors have recognized, among other things, that a solution to the glitch problem can include or use a test system output stage with multiple parallel instances of switch circuits in an output signal path. The solution can include control circuitry that is configured to coordinate desired output signal change characteristics with amplifier and switch circuit behavior. For example, the solution can include or use the control circuit to change a number of the parallel instances, or branches, of the switch circuits that are closed (and therefore conducting) in coordination with changes in output signal characteristics from one or more force amplifiers that provide or contribute to the output signal. The control circuit can include processing circuitry (e.g., one or more of a processor, an application specific integrated circuit, or a field programmable gate array) to perform the functions described.

Figure 4:
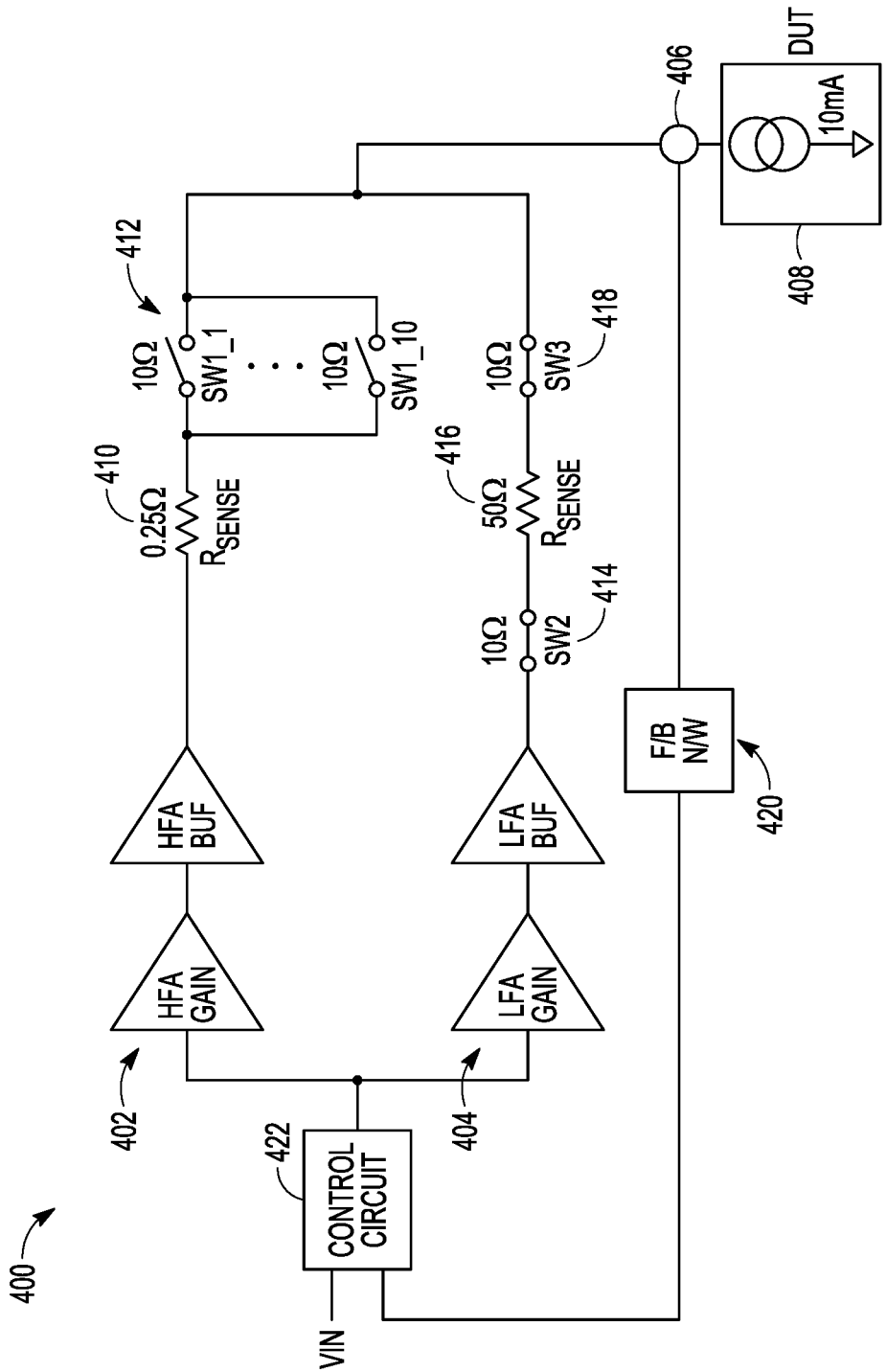
FIG. 4 illustrates generally an example of a portion of an automated test system with a parallel switching circuit.

FIG. 4 illustrates generally a second automated test system 400 that can include a portion of a ATE system that includes or uses a parallel switching circuit 412 having multiple independent branch circuits. The second automated test system 400 can include a first output stage 402 configured to provide a first portion of an output test signal to a DUT 408 at a DUT node 406. The first output stage 402 can include an HFA gain amplifier, an HFA buffer, a first sense resistor 410, and the parallel switching circuit 412. The parallel switching circuit 412 can include multiple branch circuits, or parallel switch circuit instances. For example, the parallel switching circuit 412 of FIG. 4 can include ten discrete parallel switches SW1_1 through SW1_10. In the example of FIG. 4, each of the switches in the parallel switching circuit 412 can have substantially the same resistance characteristic of, e.g., 10 Ohms, or the switches can have different resistance characteristics. In an example, each of the switches in the parallel switching circuit 412 comprises a respective pair of back-to-back NDMOS switch devices that together has a specified channel on-resistance characteristic of, e.g., about 10 Ohms. Examples of such coupled switch devices and corresponding control systems are described by Aherne et al. in "Bi-directional switch using series connected N-type MOS devices in parallel with series connected P-type MOS devices" (U.S. Pat. No. 8,710,541) and/or by Birk in "Bootstrapped switch circuit" (U.S. Pat. No. 7,952,419), each of which is incorporated by reference herein in its entirety.

The second automated test system 400 can include a second output stage 404 configured to provide a second portion of an output test signal to the DUT 408 at the DUT node 406. The second output stage 404 can include an LFA gain amplifier, an LFA buffer, an LFA buffer switch 414, a second sense resistor 416, and an LFA output switch 418. In an example, the LFA buffer switch 414 or the LFA output switch 418 can have a resistance characteristic that is about the same as a resistance characteristic of one of the switches in the parallel switching circuit 412. In an example, each of the LFA buffer switch 414, the LFA output switch 418, and the switch instances of the parallel switching circuit 412 can comprise different instances of the same similarly-configured switch device, such as a back-to-back NMOS pair having substantially the same physical features or size characteristics.

The second automated test system 400 can further include a control circuit 422 configured to control the first output stage 402 and the second output stage 404 based on information from a feedback network 420 and, optionally, based on external operating instructions. For example, the control circuit 422 can be configured to sense information about signal characteristics at the DUT node 406 and, in response, control gain characteristics of one or more of the HFA and LFA gain amplifiers, or control a switching status of one or more of the LFA buffer switch 414, the LFA output switch 418, or of one or more of the switch instances in the parallel switching circuit 412. In an example, the control circuit 422 can be configured to use information about a voltage magnitude at the DUT node 406, such as sensed using the feedback network 420, to control an output magnitude of the first portion of the output test signal from the first output stage 402 or to control an output magnitude of the second portion of the output test signal from the second output stage 404.

In an example, the control circuit 422 can help mitigate glitch at the DUT node 406 at or during a transition between test signals provided using different signal paths, such as using signal paths in the first output stage 402 and the second output stage 404. For example, the control circuit 422 can help coordinate a transition from a first test signal, such as provided (e.g., exclusively or non-exclusively) using the second output stage 404, to a second test signal, such as provided (e.g., exclusively or non-exclusively) using the first output stage 402. At the time of transition, the first and second test signals can have similar magnitude characteristics. The transition can include controlling a turn-on sequence of switches in the parallel switching circuit 412 and, optionally, a turn-off sequence of the LFA buffer switch 414 or the LFA output switch 418. The control circuit 422 can be further configured to coordinate a transition from the second test signal back to the first test signal or to another signal. In an example, the control circuit 422 can be configured to turn on or turn off the switches in the parallel switching circuit 412 sequentially, or one at a time, to help minimize signal glitch at the DUT node 406.

Figure 5:
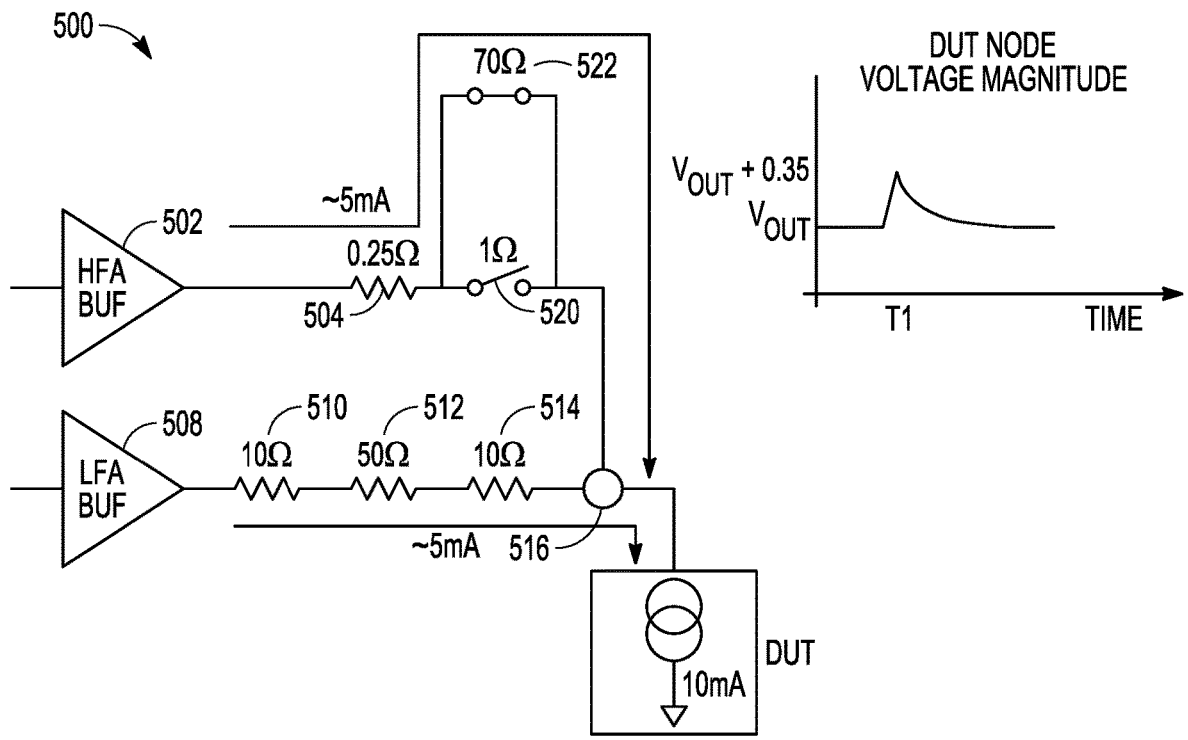
FIG. 5 and FIG. 6 illustrate generally a second example circuit that comprises a portion of an automated test system.
Figure 6:
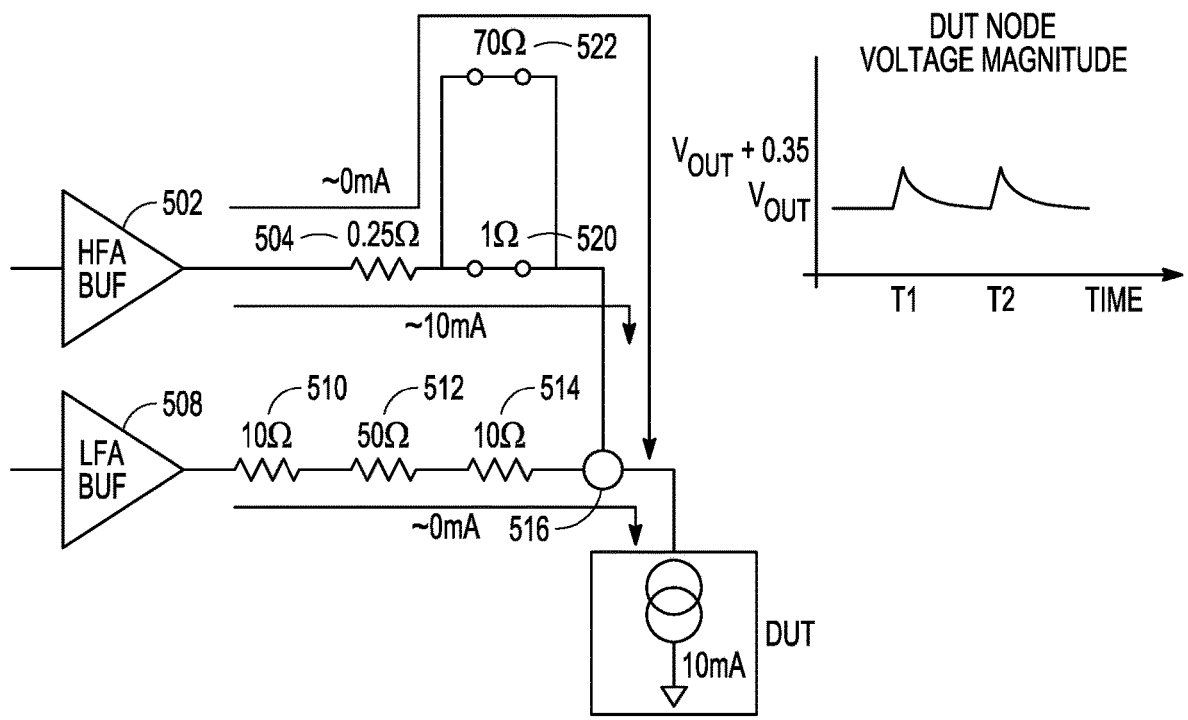

FIG. 5 and FIG. 6 illustrate generally a second example circuit 500 that comprises a portion of the second automated test system 400. The second example circuit 500 includes a first stage amplifier 502 configured to provide relatively higher magnitude test signals to a DUT 518 at a DUT node 516 via a series first stage sense resistor 504 and a switch circuit 506. The second example circuit 500 includes a second stage amplifier 508 configured to provide relatively lower magnitude test signals to the DUT node 516 via a series second stage sense resistor isolation switch 510, a second stage sense resistor 512, and a second stage output switch 514. In the example of FIG. 5, the second stage sense resistor isolation switch 510 and the second stage output switch 514 are pictorially represented in a closed state by their equivalent on-resistance of 10 Ohms. Switches having other resistance characteristics can similarly be used. In an example, the second stage sense resistor isolation switch 510 and the second stage sense resistor 512 can represent an array of switched sense resistor paths having different resistance characteristics. The switch circuit 506 includes a first switch instance 520 and a second switch instance 522 coupled in parallel. Additional switch instances can similarly be included in parallel in the switch circuit 506, or the second switch instance 522 can represent multiple switch instances that are actuated together.

The example of FIG. 5 illustrates generally a configuration of the second example circuit 500 corresponding to a portion of a DUT drive signal transition at time T1. Preceding the transition, the DUT 518 can receive a 10 mA drive signal from, e.g., the second stage amplifier 508, through about 70 Ohms (e.g., provided by the series combination of the second stage sense resistor isolation switch 510, the second stage sense resistor 512, and the second stage output switch 514). Concurrently with the second stage amplifier 508 providing the 10 mA drive signal, the first stage amplifier 502 can be off or decoupled from the DUT node 516.

At the time of the drive signal transition T1, the control circuit 422 can (1) control the second stage amplifier 508 to reduce a magnitude of its output signal, (2) control the first stage amplifier 502 to provide an output signal, and (3) control one or more of the switches in the switch circuit 506 to couple the output signal from the first stage amplifier 502 to the DUT node 516. That is, the control circuit 422 can be used to control the first stage amplifier 502 and the second stage amplifier 508 to provide respective current signals (e.g., equal in voltage or current magnitude) to the DUT node 516. In the illustrated example of FIG. 5, the drive signal transition includes the first stage amplifier 502 and the second stage amplifier 508 each providing respective 5 mA drive signals (e.g., at $V_{OUT}$+0.35 V) to the DUT 518 through matched impedances. For example, the first stage amplifier 502 provides 5 mA through about 70 Ohms (e.g., provided by the second switch instance 522), and the second stage amplifier 508 provides 5 mA through about 70 Ohms (e.g., provided by the series combination of the second stage sense resistor isolation switch 510, the second stage sense resistor 512, and the second stage output switch 514). Since the DUT node 516 is loaded by substantially the same drive current before and at the time T1 of the transition, the glitch at the DUT node 516 can be reduced. For example, the total glitch can be reduced by about half relative to the example of FIG. 2 and FIG. 3 (e.g., from 0.7 V to 0.35 V).

Following the transition at time T1 illustrated in FIG. 5, the control circuit 422 can use information from the feedback network 420 to monitor the DUT 518 voltage and, in response, change an input or output voltage characteristic of the drive signals from the first stage amplifier 502 and the second stage amplifier 508. In an example, the control circuit 422 can adjust a control voltage at an input of the first stage amplifier 502 and the second stage amplifier 508 to thereby correct the magnitude of the combined output signal at the DUT node 516.

Referring now to FIG. 6, at time T2, the control circuit 422 can turn on the first switch instance 520 of the switch circuit 506. Since the DUT node 516 voltage and the outputs of the amplifiers may not change instantaneously, the first stage amplifier 502 and the second stage amplifier 508 can provide substantially the same output voltage signals for a brief time (e.g., at T2), which in turn can cause a glitch at the DUT node 516.

Following the transition at time T2 illustrated in FIG. 6, the control circuit 422 can use information from the feedback network 420 to monitor the DUT 518 voltage and, in response, change an output voltage characteristic of the drive signal from the first stage amplifier 502 to correct the overshoot voltage at the DUT node 516. Substantially all of the DUT current can flow through the lower-impedance first switch instance 520 (e.g., having an on-resistance of about 1 Ohm) after time T2. Accordingly, the first stage amplifier 502 can be used, or controlled by the control circuit 422, to provide relatively higher magnitude test signals to the DUT 518.

In the example of FIG. 5 and FIG. 6, the glitch magnitude at the DUT node 516 can thus be reduced by spreading out output signal changes over time. That is, one of multiple switch instances in the switch circuit 506 can be switched on at a first time (e.g., at time T1) to reduce a loading effect on a DUT node when switching between signal source paths, such as can be served by respective different drive amplifiers. One or more other switch instances in the switch circuit 506 can be switched on at a later time (e.g., at time T2) to gradually change a total impedance of a signal path serving the DUT node. Conversely, one of multiple switch instances in the switch circuit 506 can be switched off at a first time (e.g., at time T1) to increase a loading effect on a DUT node when switching between signal source paths, and one or more other switch instances in the switch circuit 506 can be switched off at a later time (e.g., at time T2) to gradually change a total impedance of a signal path serving the DUT node.

The timing of switch status changes can be based on measured DUT node signal characteristics, such as to ensure adequate settling time between changes. In an example, the period or duration when the DUT node is driven using signals from each of the first stage amplifier 502 and the second stage amplifier 508 can be referred to as a "make-before-break" time. That is, the two amplifiers can be used together to "make" the output achieve a particular signal characteristic before one of the amplifiers "breaks" or is removed from the signal path.

Figure 7:
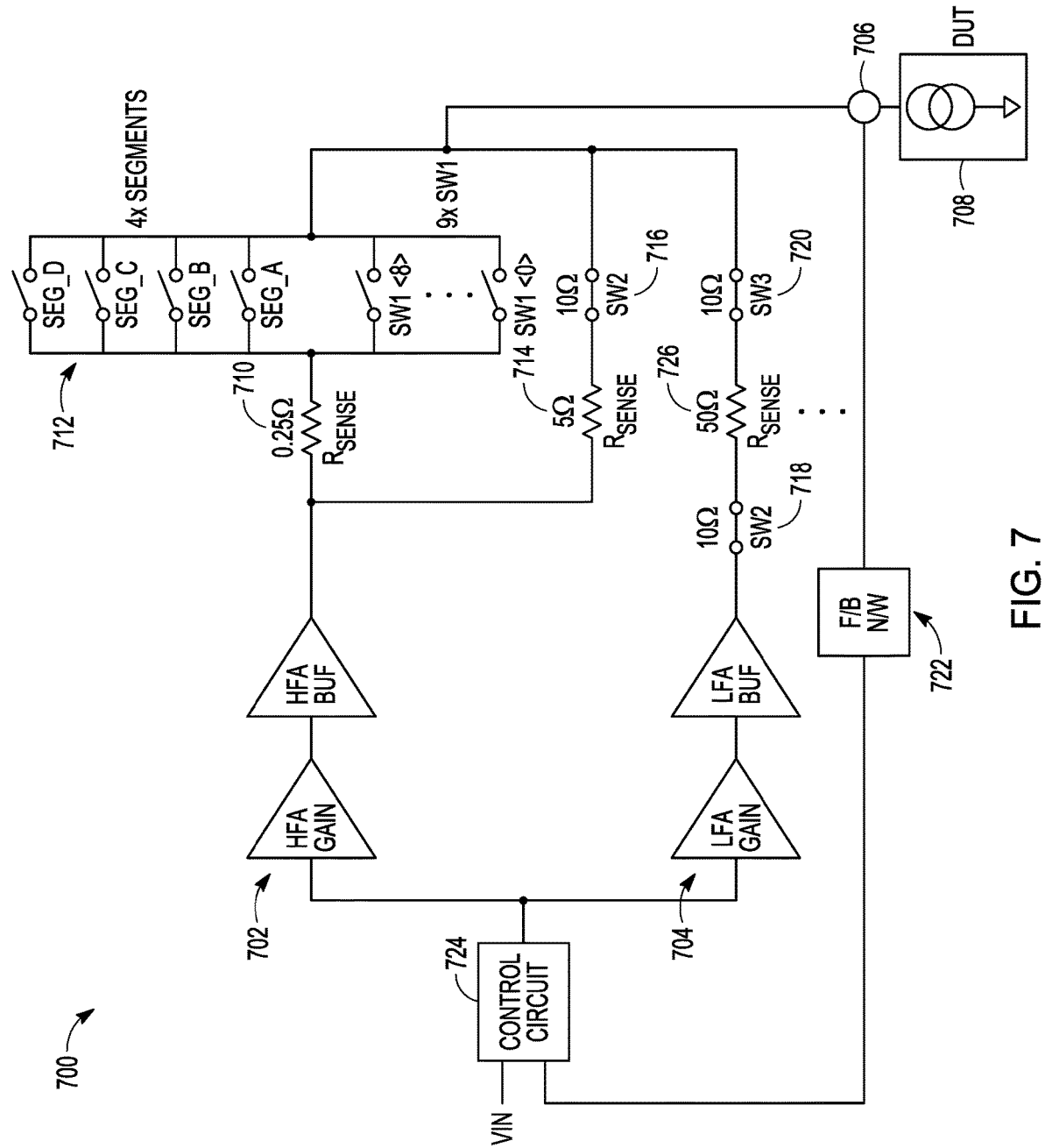
FIG. 7 illustrates generally an example of a portion of an automated test system with a parallel switching circuit.

The present inventors have recognized a need for further control and granularity with respect to output signals provided to a DUT using multiple different signal paths, and optionally multiple different drive circuits or amplifiers. FIG. 7 illustrates generally a third example circuit 700 that includes a first output stage 702 and a second output stage 704 configured to selectively provide drive signals to a DUT 708 at a DUT node 706, such as based on control signals from a control circuit 724. The control circuit 724 can coordinate operations of the first output stage 702 or the second output stage 704 based on information from the DUT 708 received via a feedback network 722. In an example, the second output stage 704 includes output amplifier and buffer circuitry that is configured to provide DUT drive signals via a series coupled third sense resistor isolation switch 718, third sense resistor 726, and third signal path output switch 720.

In the example of FIG. 7, the first output stage 702 includes output amplifier and buffer circuitry that is configured to provide DUT drive signals via parallel first and second signal paths. The first signal path includes a first sense resistor 710 coupled to a multiple-segment parallel switching circuit 712. The second signal path includes a second sense resistor 714 coupled to a second signal path output switch 716. In an example, the first sense resistor 710 and the second sense resistor 714 can be similarly valued or can have different resistance characteristics. In the example of FIG. 7, the first sense resistor 710 has a resistance of about 0.25 Ohms and the second sense resistor 714 has a resistance of about 5 Ohms.

The multiple-segment parallel switching circuit 712 can include multiple different switch devices coupled in parallel. Any two or more of the different switch devices can be similarly or differently configured. For example, a first group of the parallel switch devices, labeled SEG_A through SEG_D, can comprise devices having respective different on-resistance characteristics. For example, SEG_D can have a least on-resistance of about 20 Ohms, SEG_A can have a greatest on-resistance of about 130 Ohms, and SEG_B and SEG_C can have intermediate on-resistance values. In an example, a second group of the parallel switch devices, labeled SW1<0> through SW1<8>, can comprise devices having substantially the same on-resistance characteristics. For example, each switch device SW1<x> can have an on-resistance of 10 Ohms. The various switch devices in the multiple-segment parallel switching circuit 712 can be independently controlled by the control circuit 724, such as to control an impedance characteristic of the signal path or paths serving the DUT node 706 from the amplifier in the first output stage 702.

In an example that includes a transition from an DUT drive signal provided by the second output stage 704 to a DUT drive signal provided by the first output stage 702, the control circuit 724 can coordinate switching of the elements of the multiple-segment parallel switching circuit 712 such that a greater resistance path is used initially. Then, the path resistance through the multiple-segment parallel switching circuit 712 can be gradually reduced. For example, the switch segment SEG_A (e.g., with an on-resistance of about 130 Ohms) can be switched on first, followed by the switch segment SEG_B (e.g., with an on-resistance of about 75 Ohms), and so on, until all of the switches in the multiple-segment parallel switching circuit 712 are conducting. When all of the switches in the multiple-segment parallel switching circuit 712 are on, the second output stage 704 amplifier can optionally be switched off and/or the third sense resistor isolation switch 718 or the third signal path output switch 720 can optionally be opened to decouple the second output stage 704 from the DUT node 706. The switching sequence can be performed in the opposite order, such as from least resistance to greatest resistance, to changeover from the DUT drive signal provided by the first output stage 702 to a different DUT drive signal provided by the second output stage 704.

In another example, multiple signal paths extending from one drive amplifier can be independently switched to present various different series resistances at the DUT node 706. For example, differently valued sense resistors can be provided in series with the output buffer circuitry of the first output stage 702 to facilitate different levels of sensing accuracy. For example, a relatively larger series sense resistor can be used to more accurately sense smaller currents or smaller changes in currents in the signal path.

In the example of FIG. 7, the first output stage 702 includes a drive amplifier that is coupled to the DUT node 706 via first and second parallel signal paths. The first signal path includes the first sense resistor 710 and the multiple-segment parallel switching circuit 712, and the second signal path includes the second sense resistor 714 and the second signal path output switch 716. The first sense resistor 710 and the second sense resistor 714 can have different resistance characteristics. In operation, the control circuit 724 can be used to control switching of the second signal path output switch 716 and the multiple-segment parallel switching circuit 712 to correspondingly change impedance characteristics of the signal path extending from the drive amplifier of the first output stage 702, to the DUT node 706. Glitch at the DUT node 706 due to such signal path changes can be mitigated using the control circuit 724 to control the turn-on or turn-off sequence of the individual switch segments in the multiple-segment parallel switching circuit 712.

Figure 8:
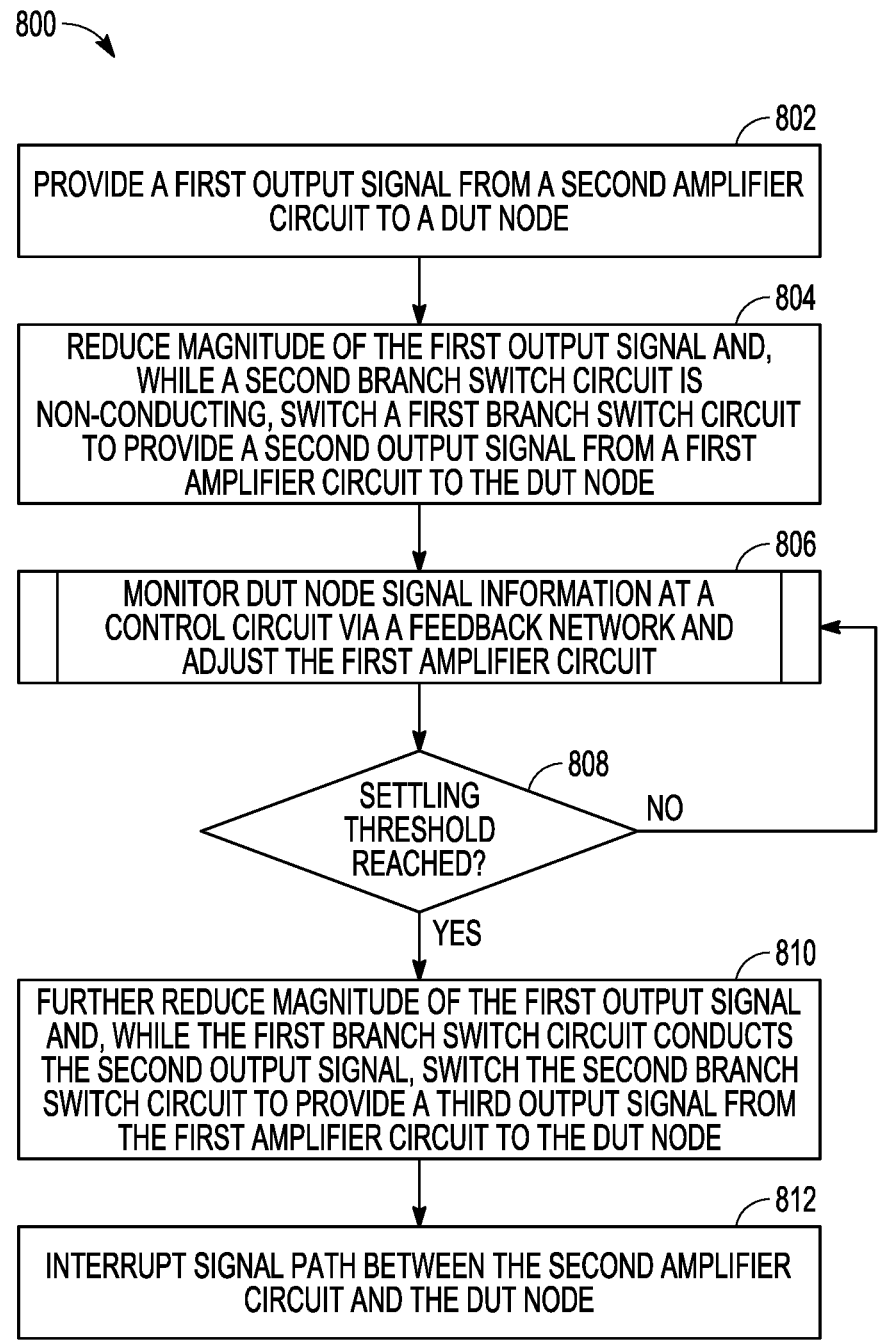
FIG. 8 illustrates generally an example of a signal transition method that can include or use a parallel switching circuit.

FIG. 8 illustrates generally an example of a signal transition method 800 that can include or use the second automated test system 400 or the third example circuit 700. References in the following discussion of the signal transition method 800 are made to the third example circuit 700 for illustrative purposes only.

The signal transition method 800 can begin at block 802 with providing a first output signal from a second amplifier circuit to a DUT node. For example, block 802 can include providing a first DUT drive signal from the amplifier in the second output stage 704 to the DUT node 706.

At block 804, the signal transition method 800 can continue with reducing a magnitude of the first output signal provided at block 802 and, while a second branch switch circuit is non-conducting, switching a first branch switch circuit to provide a second output signal from a first amplifier circuit to the DUT node 706. For example, block 804 can include using the control circuit 724 to initiate a make-before-break algorithm whereby the amplifier in the second output stage 704 can be used in coordination with an amplifier in the first output stage 702 to provide the DUT drive signal. During an operating interval corresponding to block 804, the control circuit 724 can switch a first branch switch circuit, or switch segment, of the multiple-segment parallel switching circuit 712 to a conducting state and can maintain one or more other branch switch circuits, or switch segments, in the multiple-segment parallel switching circuit 712 in a non-conducting state. The first branch switch circuit can have a resistance magnitude characteristic that exceeds the resistance magnitude characteristic of the one or more other branch switch circuits. During the same operating interval, the control circuit 724 can control the first amplifier in the first output stage 702 and the second amplifier in the second output stage 704 to provide signals that, together, provide a drive signal to the DUT node 706. When the combined signals are provided, a small glitch can appear at the DUT node 706, such as due to the loading effects of closing the first branch switch circuit (see, e.g., FIG. 5).

At subroutine block 806, the signal transition method 800 can include monitoring signal information from the DUT node and optionally adjusting an output of the first amplifier in the first output stage 702. For example, subroutine block 806 can include using the control circuit 724 to monitor glitch information from the DUT node 706, such as received via the feedback network 722. The control circuit 724 can respond to the glitch information by changing an output signal magnitude characteristic of the first amplifier in the first output stage 702 or of the second amplifier in the second output stage 704. At decision block 808, the signal transition method 800 can include determining whether a settling threshold is reached. For example, decision block 808 can include using the control circuit 724 to determine whether the DUT node 706 voltage is within a specified tolerance range of a specified target voltage (e.g., $V_{OUT}$). If the settling threshold is not reached, then the signal transition method 800 can return to subroutine block 806 and further adjust one or more of the amplifiers. If the settling threshold is reached, then the signal transition method 800 can continue to block 810.

At block 810, the signal transition method 800 can include reducing a magnitude of the first output signal (e.g., provided by the amplifier in the second output stage 704) and, while the first branch circuit conducts the second output signal (e.g., provided by the amplifier in the first output stage 702), switching a second branch switch circuit to provide a third output signal from the first amplifier circuit to the DUT node. For example, block 810 can include using multiple branches of the multiple-segment parallel switching circuit 712 to provide respective portions of a test signal (e.g., the second output signal and the third output signal) to the DUT node 706.

At block 812, the signal transition method 800 can include interrupting a signal path between the second amplifier circuit and the DUT node. For example, block 812 can include opening one or more of the third sense resistor isolation switch 718 and the third signal path output switch 720 such that the DUT drive signal can be provided exclusively by the first output stage 702 via the multiple-segment parallel switching circuit 712 or via the second signal path output switch 716.

Various aspects of the present disclosure can help provide a solution to the test system-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a first switch circuit coupled to an input/output (I/O) connection, wherein the first switch circuit comprises multiple parallel instances of switch circuits with respective resistance characteristics, a second switch circuit coupled to the I/O connection, a first force amplifier configured to provide a first drive signal to the I/O connection via the first switch circuit and/or via the second switch circuit, and a control circuit configured to control the first switch circuit and the second switch circuit to mitigate glitch at the I/O connection when switching between signal paths from the first and second switch circuits.

In Aspect 2, the subject matter of Aspect 1 includes a second force amplifier configured to provide a second drive signal to the I/O connection via the second switch circuit, wherein the control circuit is configured to control the first switch circuit to mitigate the glitch at the I/O connection when switching between the drive signals from the first and second force amplifiers.

In Aspect 3, the subject matter of Aspect 2 includes the control circuit configured to receive information from the I/O connection and, in response, control the first and second force amplifiers to minimize a magnitude difference between the first and second drive signals.

In Aspect 4, the subject matter of Aspects 1-3 includes the multiple parallel instances of the switch circuits having respective different transistor channel resistance characteristics.

In Aspect 5, the subject matter of Aspects 1-4 includes the control circuit configured to enable respective ones of the switch circuits in the first switch circuit in a time-delayed sequence while the first force amplifier provides the first drive signal.

In Aspect 6, the subject matter of Aspect 5 includes a second force amplifier configured to provide a second drive signal to the I/O connection via the second switch circuit, wherein the control circuit is configured to coordinate, with the time-delayed sequence, a reduction in a magnitude difference between the first and second drive signals.

In Aspect 7, the subject matter of Aspects 1-6 includes a first sense resistor provided in series between an output of the first force amplifier and the first switch circuit, and a second sense resistor provided in series with the second switch circuit.

In Aspect 8, the subject matter of Aspects 1-7 includes the control circuit configured to coordinate a transition from the first drive signal at the I/O connection to a second drive signal at the I/O connection, wherein the first drive signal is provided via the first and second switch circuits, and wherein the second drive signal is provided via the first switch circuit and not the second switch circuit.

In Aspect 9, the subject matter of Aspects 1-8 includes the control circuit configured to coordinate a transition from the first drive signal at the I/O connection to a second drive signal at the I/O connection, wherein the first drive signal is provided via the first switch circuit and not the second switch circuit, and wherein the second drive signal is provided via the first and second switch circuits.

In Aspect 10, the subject matter of Aspects 1-9 includes each of the instances of the switch circuits of the first switch circuit comprising a respective source-coupled arrangement of NDMOS devices.

In Aspect 11, the subject matter of Aspects 1-10 includes a second force amplifier configured to provide a second drive signal to the I/O connection via the second switch circuit, wherein the first force amplifier is configured to source or sink current signals having a greater first current signal magnitude range at the I/O connection, and the second force amplifier is configured to source or sink current signals having a lesser second current signal magnitude range at the I/O connection.

In Aspect 12, the subject matter of Aspects 1-11 includes the control circuit configured to use a make-before-break algorithm to control switching between the signal paths from the first and second switch circuits.

In Aspect 13, the subject matter of Aspects 1-12 includes the second switch circuit comprising multiple parallel instances of additional switch circuits with the same or different resistance characteristics.

Aspect 14 can include a method comprising transitioning an output test signal for a device under test (DUT) at an output node from an initial signal provided via a first switched path to a subsequent signal provided via a second switched path. In Aspect 14, the transitioning can include, at a parallel switching circuit comprising multiple independent branch circuits that couple the second amplifier circuit to the output node: while a second branch circuit is non-conducting, switching a first branch circuit to conduct a first portion of the output test signal, wherein the first branch circuit has a first on-resistance, and after a first delay and while the first branch circuit is conducting, switching the second branch circuit to conduct a second portion of the output test signal, wherein the second branch circuit has a different second on-resistance and the first and second branch circuits are coupled in parallel, and wherein the first and second portions of the output test signal are provided by the same first amplifier circuit.

In Aspect 15, the subject matter of Aspect 14 includes switching the second branch circuit to conduct the second portion of the output test signal, and further includes switching off a signal path between a second amplifier circuit and the output node.

In Aspect 16, the subject matter of Aspects 14-15 includes transitioning the output test signal to include transitioning from a lower magnitude initial signal to a greater magnitude subsequent signal, and the first on-resistance of the first branch circuit is greater than the second on-resistance of the second branch circuit.

In Aspect 17, the subject matter of Aspects 14-16 includes, after a second delay, transitioning the output test signal at the output node from the subsequent signal back to the initial signal by switching off the second branch circuit.

In Aspect 18, the subject matter of Aspects 14-17 includes providing the initial signal using a second amplifier circuit, and providing the subsequent signal using the first amplifier circuit, wherein the first amplifier circuit is coupled to the output node by the branch circuits of the parallel switching circuit.

In Aspect 19, the subject matter of Aspects 14-18 includes the initial signal and the subsequent signal having different current magnitude characteristics.

In Aspect 20, the subject matter of Aspects 14-19 includes a duration of the first delay depending on a settling time of the output test signal at the output node after switching the first branch circuit to conduct the first portion of the output test signal.

In Aspect 21, the subject matter of Aspect 20 includes, using a feedback network, sensing a magnitude of the output test signal at the output node and, in response to the magnitude of the output test signal satisfying a specified threshold magnitude condition, switching the second branch circuit to conduct the second portion of the output test signal.

In Aspect 22, the subject matter of Aspects 14-21 includes, following a settling time after switching the second branch circuit, interrupting a circuit path between the first amplifier circuit and the output node.

Aspect 23 can include or use a transition signal driving circuit that selectively enables current paths depending on information about a desired voltage transition magnitude to minimize switching glitch in a test system when an output signal transitions between different amplitudes. In Aspect 23, the transition driving circuit can include a first driver circuit comprising a first current source coupled to multiple parallel current paths that are respectively enabled or disabled based on the desired voltage transition magnitude, wherein the first driver circuit is configured to provide to a device under test (DUT) node, using current from the first current source provided through one or more of the current paths, a first test signal having a greater first amplitude characteristic, and a second driver circuit configured to provide, to the output node, a second test signal having a lesser second amplitude characteristic. Aspect 23 can further optionally include a control circuit configured to control the first and second driver circuits, and to control switches in the parallel current paths, to provide the output signal using the first test signal from the first driver circuit together with the second test signal from the second driver circuit.

In Aspect 24, the subject matter of Aspect 23 includes the switches in the parallel current paths having respective different on-resistance characteristics.

In Aspect 25, the subject matter of Aspects 23-24 includes a feedback network coupling the control circuit to the DUT node.

In Aspect 26, the subject matter of Aspect 25 includes the control circuit configured to use information from the feedback network about a voltage magnitude at the DUT node to control magnitude characteristics of the first and second test signals.

In Aspect 27, the subject matter of Aspects 25-26 includes the control circuit configured to use information from the feedback network about a voltage magnitude at the DUT node to minimize a magnitude difference between the first and second test signals.

Aspect 28 can include at least one machine-readable medium including instructions that, when executed by processing circuitry, cause the processing circuitry to perform operations to implement of any of Aspects 1-27.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
   a first switch circuit coupled to an input/output (I/O) connection, wherein the first switch circuit comprises multiple parallel instances of switch circuits with respective resistance characteristics;
   a second switch circuit coupled to the I/O connection;
   a first force amplifier configured to provide a first drive signal to the I/O connection via the first switch circuit and/or via the second switch circuit; and
   a control circuit configured to control the first switch circuit and the second switch circuit to mitigate glitch at the I/O connection when switching between signal paths from the first and second switch circuits;
   wherein the control circuit is configured to coordinate a transition from the first drive signal at the I/O connection to a second drive signal at the I/O connection, wherein the first drive signal is provided via the first and second switch circuits, and wherein the second drive signal is provided via the first switch circuit and not the second switch circuit.

2. The system of claim 1, further comprising a second force amplifier configured to provide a second drive signal to the I/O connection via the second switch circuit;
   wherein the control circuit is configured to control the first switch circuit to mitigate the glitch at the I/O connection when switching between the drive signals from the first and second force amplifiers.

3. The system of claim 2, wherein the control circuit is configured to receive information from the I/O connection and, in response, control the first and second force amplifiers to minimize a magnitude difference between the first and second drive signals.

4. The system of claim 1, wherein the control circuit is configured to enable respective ones of the switch circuits in the first switch circuit in a time-delayed sequence while the first force amplifier provides the first drive signal.

5. The system of claim 1, further comprising a second force amplifier configured to provide the second drive signal to the I/O connection via the second switch circuit;
   wherein the control circuit is configured to enable respective ones of the switch circuits in the first switch circuit in a time-delayed sequence while the first force amplifier provides the first drive signal, and wherein the control circuit is configured to coordinate, with the time-delayed sequence, a reduction in a magnitude difference between the first and second drive signals.

6. The system of claim 1, further comprising a second force amplifier configured to provide the second drive signal to the I/O connection via the second switch circuit;
wherein the first force amplifier is configured to source or sink current signals having a greater first current signal magnitude range at the I/O connection, and the second force amplifier is configured to source or sink current signals having a lesser second current signal magnitude range at the I/O connection.

7. The system of claim 1, wherein the control circuit is configured to use a make-before-break algorithm to control switching between the signal paths from the first and second switch circuits.

8. A method comprising:
transitioning an output test signal for a device under test (DUT) at an output node from an initial signal provided via a first switched path to a subsequent signal provided via a second switched path, wherein the initial signal and the subsequent signal have different current magnitude characteristics, the transitioning including:
at a parallel switching circuit comprising multiple independent branch circuits that couple a first amplifier circuit to the output node:
while a second branch circuit is non-conducting, switching a first branch circuit to conduct a first portion of the output test signal, wherein the first branch circuit has a first on-resistance; and
after a first delay and while the first branch circuit is conducting, switching the second branch circuit to conduct a second portion of the output test signal, wherein the second branch circuit has a different second on-resistance and the first and second branch circuits are coupled in parallel, wherein the initial signal is provided by a second amplifier circuit via a signal path between the second amplifier circuit and the output node, and wherein switching the second branch circuit to conduct the second portion of the output test signal further includes switching off the signal path between the second amplifier circuit and the output node;
wherein the first and second portions of the output test signal are provided by the first amplifier circuit.

9. The method of claim 8, wherein transitioning the output test signal includes transitioning from a lower magnitude initial signal to a greater magnitude subsequent signal, and wherein the first on-resistance of the first branch circuit is greater than the second on- resistance of the second branch circuit.

10. The method of claim 8, further comprising, after a second delay, transitioning the output test signal at the output node from the subsequent signal back to the initial signal by switching off the second branch circuit.

11. The method of claim 8, further comprising:
providing the subsequent signal using the first amplifier circuit, wherein the first amplifier circuit is coupled to the output node by the branch circuits of the parallel switching circuit.

12. The method of claim 8, wherein a duration of the first delay depends on a settling time of the output test signal at the output node after switching the first branch circuit to conduct the first portion of the output test signal.

13. The method of claim 12, further comprising using a feedback network, sensing a magnitude of the output test signal at the output node and, in response to the magnitude of the output test signal satisfying a specified threshold magnitude condition, switching the second branch circuit to conduct the second portion of the output test signal.

14. The method of claim 8, further comprising, following a settling time after switching the second branch circuit, interrupting a circuit path between the first amplifier circuit and the output node.

15. A transition signal driving circuit that selectively enables current paths depending on information about a desired voltage transition magnitude to minimize switching glitch in a test system when an output signal transitions between different amplitudes, the transition driving circuit comprising:
a first driver circuit comprising a first current source coupled to multiple parallel current paths that are respectively enabled or disabled based on the desired voltage transition magnitude, wherein the first driver circuit is configured to provide to a device under test (DUT) node, using current from the first current source provided through one or more of the current paths, a first test signal having a greater first amplitude characteristic;
a second driver circuit comprising a second current source and configured to provide, to the output node, a second test signal having a lesser second amplitude characteristic; and
a control circuit configured to control the first and second driver circuits, and to control switches in the parallel current paths in an order that is based on respective different on-resistance characteristics of the switches, to provide the output signal using the first test signal from the first driver circuit together with the second test signal from the second driver circuit.

16. The transition signal driving circuit of claim 15, further comprising a feedback network coupling the control circuit to the DUT node, wherein the control circuit is configured to use information from the feedback network about a voltage magnitude at the DUT node to control magnitude characteristics of the first and second test signals.

17. The transition signal driving circuit of claim 15, further comprising a feedback network coupling the control circuit to the DUT node, wherein the control circuit is configured to use information from the feedback network about a voltage magnitude at the DUT node to minimize a magnitude difference between the first and second test signals.

\* \* \* \* \*